(12) United States Patent
Kitayama (10) Patent No.: US 7,864,610 B2
(45) Date of Patent: Jan. 4, 2011

(54) SENSE AMPLIFIER CONTROLLING CIRCUIT AND CONTROLLING METHOD

(75) Inventor: Makoto Kitayama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 138 days.

(21) Appl. No.: 12/289,385

(22) Filed: Oct. 27, 2008

(65) Prior Publication Data

US 2009/0109779 A1   Apr. 30, 2009

(30) Foreign Application Priority Data

Oct. 29, 2007   (JP) ............................. 2007-280509

(51) Int. Cl.
*G11C 7/02* (2006.01)
(52) U.S. Cl. ................... 365/207; 365/205; 365/196; 365/185.21
(58) Field of Classification Search ................. 365/205, 365/185.21, 196, 207
See application file for complete search history.

(56) References Cited

U.S. PATENT DOCUMENTS

| | | | |
|---|---|---|---|
| 6,285,613 B1 | 9/2001 | Koya | |
| 6,418,067 B1 * | 7/2002 | Watanabe et al. | 365/200 |
| 6,469,546 B2 | 10/2002 | Matano | |
| 6,492,211 B1 * | 12/2002 | Divakaruni et al. | 438/155 |
| 6,862,247 B2 * | 3/2005 | Yamazaki | 365/230.03 |
| 2002/0154562 A1 * | 10/2002 | Endo et al. | 365/205 |
| 2008/0175084 A1 | 7/2008 | Akiyama et al. | |

FOREIGN PATENT DOCUMENTS

| | | |
|---|---|---|
| JP | 11-232880 | 2/1999 |
| JP | 2000-293986 | 10/2000 |
| JP | 2001-015710 | 1/2001 |
| JP | 2001-332087 | 11/2001 |

* cited by examiner

*Primary Examiner*—Vu A Le
*Assistant Examiner*—Han Yang
(74) *Attorney, Agent, or Firm*—Foley & Lardner LLP

(57) ABSTRACT

A sense amplifier controlling circuit for controlling a sense amplifier in a semiconductor memory, which amplifies differential electric potential of a pair of bit lines to which memory cells are connected by sequentially operating a CMOS flip-flop and a preamplifier performing an amplification operation different from each other, controls the sense amplifier, and activate the preamplifier at an early operation stage of the CMOS flip-flop and the preamplifier independently of activation of the CMOS flip-flop during the amplification operation of the CMOS flip-flop.

19 Claims, 8 Drawing Sheets

SENSE AMPLIFIER CONTROLLING CIRCUIT AND CONTROLLING METHOD

BACKGROUND OF THE INVENTION

1. Field of the Invention

The present invention relates to a sense amplifier being used in a semiconductor memory. More particularly, the present invention relates to a sense amplifier controlling circuit and a controlling method suitable for reading and rewriting control of a sense amplifier on which a preamplifier is mounted.

Priority is claimed on Japanese Patent Application No. 2007-280509, filed Oct. 29, 2007, the content of which is incorporated herein by reference in its entirety.

2. Description of Related Art

With the development of recent digital technology, a digitalized portable device such as a cellular phone or a portable media player has been manufactured and rapid technical innovation in this connection has been achieved. Such technical innovation for the portable device has achieved device miniaturization and long operating time, in addition to the improvement of processing performance. The portable device miniaturization and long operating time need miniaturization and high performance of batteries mounted on the portable device. However, these are contradictory factors, and thus it is difficult to achieve both at a high level. For this reason, a semiconductor memory mounted on a portable device particularly needs low voltage and low power consumption with a large effect.

Dynamic random access memory (DRAM), which is a kind of a semiconductor memory, requires a periodical memory holding operation. Memory cells, which are memory elements, flow a very small amount of leakage current. For this reason, the amount of information of memory cells decreases with the passage of time. When the decreased amount exceeds a limit value, data is not correctly read. In other words, data is destroyed. In order to prevent this, there is performed a memory holding operation that drives a sense amplifier at constant time intervals and returns data amplified again to memory cells. This memory holding operation has large power consumption in operations of DRAM. In connection with DRAM used in a portable device, the important problem is how to reduce this power consumption.

It is extremely important in terms of power consumption reduction to lower the operating voltage of the sense amplifier. However, the sense amplifier originally amplifies a differential electric potential of a pair of minute bit lines. Therefore, an operating speed has a large delay when lowering the operating voltage. Moreover, normal amplification is not possible. In order to guarantee the operation property of the sense amplifier at a low voltage, there is a method for reducing the threshold voltage (referred to as Vth) of a transistor (referred to as Tr) included in the sense amplifier. However, in the state where a differential electric potential amplification of a pair of bit lines is saturated, the sense amplifier leakage current flows from a flip-flop of a complementary metal-oxide semiconductor (CMOS), which is a main component thereof. The amount of leakage current becomes larger with decreasing Vth. Since the dependency of the amount of leakage current on Vth is not linear, the difference of Vth of dozens of % may give rise to the difference of leakage current amount of several digits. The increase of leakage currents leads to an increase of power consumption. Since a method for reducing Vth immediately has a limit, a countermeasure by a circuit system has been tried.

Japanese Unexamined Patent Application, First Publication, No. 2001-332087 (pages 6 to 9, FIG. 1) discloses a sense amplifier in which a kind of amplifier circuit is added to the CMOS flip-flop. The added amplifier circuit performs an amplification operation different from the CMOS flip-flop in an early stage of a sense operation. In other words, the sense amplifier provides a circuit technique performing a pre-sense. This additional amplifier circuit is below referred to as a preamplifier.

A preamplifier is an additional circuit. Therefore, there is a problem that the circuit area of the sense amplifier increases. The sense amplifier is a circuit with a large recurrence number. A slight increase of the sense amplifier area has an impact on the whole area of the semiconductor memory. Thus, it is desirable to configure a circuit in which the number of newly necessary components or control signals is small. The disclosed preamplifier requires seven transistors and two control signals in a dedicated manner.

A preamplifier is not a circuit that is very generally used, like a CMOS flip-flop. The preamplifier does not have a circuit configuration that is established as a standard. It is considered that various trials will be performed on the preamplifier in the future in this field. Therefore, the above reference is silent about a preamplifier that requires four transistors and one control signal in a dedicated manner. This is a circuit configuration in which mounting is comparatively easy in view of operation timing of the control signal.

As described above, with low voltage and low power consumption of the semiconductor memory, the sense amplifier has a problem that should be solved. The sense amplifier includes the CMOS flip-flop. As the operating voltage decreases, the voltage (Vgs) between a gate and a source approaches Vth. In this case, there is a phenomenon that the differential electric potential of a pair of bit lines cannot be amplified or the speed of amplification is largely late. In order to avoid this phenomenon, it is necessary to lower Vth by adjustment in a manufacturing process of the transistor. On the other hand, in a state where the sense operation terminates and the differential electric potential of the pair of bit lines is amplified to about the power supply voltage of the sense amplifier, the leakage current is generated from the sense amplifier. The leakage current flows from an N-channel transistor (referred to as Nch Tr) of the flip-flop to ground (GND). Moreover, the leakage current flows from the power supply of the sense amplifier to a P-channel transistor (referred to as Pch Tr) of the flip-flop. The leakage current becomes larger with decreasing Vth of Tr. Since it is difficult to simultaneously achieve lowering the operation voltage and the power consumption only by adjustment of Vth, a novel approach of circuit is necessary.

Hereinafter, a problem on a circuit design revealed by the present applicant will be described. As described above, there has been recently proposed a sense amplifier on which the above-described preamplifier is mounted. The preamplifier mainly operates in an early stage of the sense operation. Then, the preamplifier stops when the differential electric potential of the pair of bit lines is amplified. Whether or not the differential electric potential of the pair of bit lines is amplified and the speed by which the differential electric potential is amplified, are determined at an early stage of the sense operation. For this reason, a preamplifier in which Vth is lowered and thus the speed of amplification is improved is used in an early stage of the sense operation. When the differential electric potential of the pair of bit lines is amplified, the leakage current is restrained by only operation of the conventional sense amplifier.

The applicant makes clear some problems in the sense method using the preamplifier. Since the number of transistors included therein increases compared to that in the conventional sense amplifier without the preamplifier, one of the problems is that the circuit area increases. Since the sense amplifier has a high recurrence number, a slight increase of area has a large impact on the chip area of a semiconductor. In order to restrain the increase of a sense amplifier circuit area with respect to the increase of transistors, it is necessary to reduce the gate width of the transistor. In particular, a main role of the CMOS flip-flop is to hold the differential electric potential of the amplified pair of bit lines. It is preferable to reduce the gate width of the transistor from the viewpoint of the suppression of the leakage current.

However, the following drawback may occur when reducing the gate width of the transistor. In other words, a first problem when reducing the Tr gate width is that a read operation (a reading operation) is delayed. In a conventional sense amplifier without the preamplifier in the read operation, the Tr gate width cannot be reduced so much in order to guarantee a sense operating speed. Therefore, the conventional sense amplifier has the capability for driving an input-output (IO) line with a load larger than that of a bit line. On the other hand, since a sense amplifier mounting the preamplifier has a tendency to reduce the Tr gate width of the CMOS flip-flop as described above, there is a problem that the capability for driving the IO line is deteriorated compared to the conventional sense amplifier.

Figure 9:
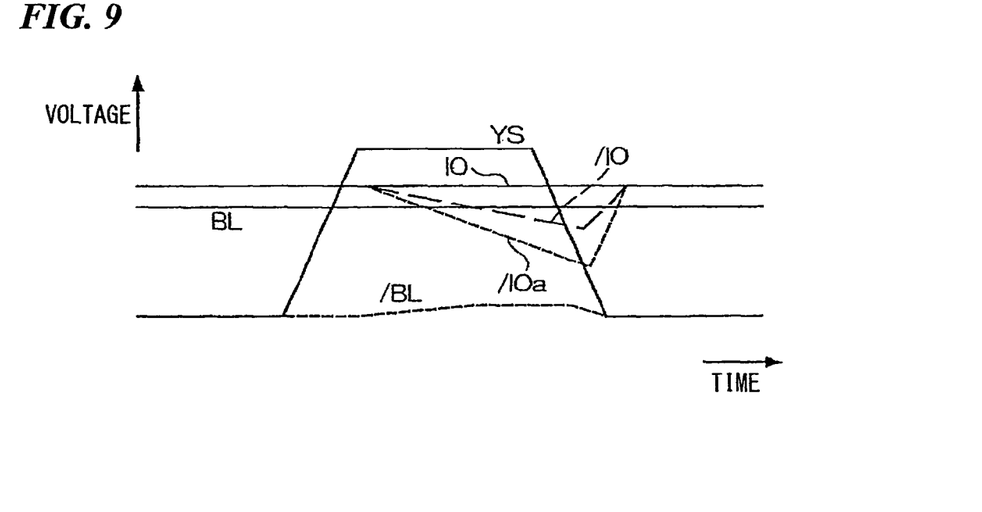
FIG. 9 is a typical waveform chart that shows a drive capability of IO lines by a sense amplifier.

Here, the degradation of drive capability of the IO line when reducing the Tr gate width will be described with reference to FIG. 9. FIG. 9 is a signal waveform chart showing signal changes of a column switch line (column selection line) YS, complementary bit lines BL and /BL, and complementary IO lines IO and /IO. In this case, a memory cell made of Tr and a capacitor, and a sense amplifier made of a CMOS flip-flop are connected to the bit lines BL and /BL. Herewith, the IO lines IO and /IO are connected to the bit lines BL and /BL via two transistors that are turned on when the column switch line YS is a high level. In connection with a signal waveform of the IO line /IO shown in FIG. 9, /IO corresponds to a waveform when the Tr gate width of the CMOS flip-flop is reduced while /IOa corresponds to a waveform when the Tr gate width of the CMOS flip-flop is not so small. Here, the symbol "/" shows one signal line of a pair of complementary signal lines.

The IO lines IO and /IO may be pre-charged to a voltage not less than an operating voltage of a memory cell array in many cases. The CMOS flip-flop draws either of IO or /IO of the IO lines to a low level. The drawing speed is dependent on the capability of electric current, that is, the gate width of the transistor of Nch Tr included in the CMOS flip-flop. For this reason, although the drawing can be performed by about /IOa in the conventional sense amplifier in which the gate width of Tr is not so small, the differential electric potential of the IO lines is reduced in the sense amplifier on which the preamplifier is mounted because the drawing can be performed by only about /IO. As a result, this results in degradation of amplification speed and the speed degradation of the whole read pass of a data amplifier that amplifies the differential electric potential of the IO lines in a peripheral circuit region.

Figure 10:
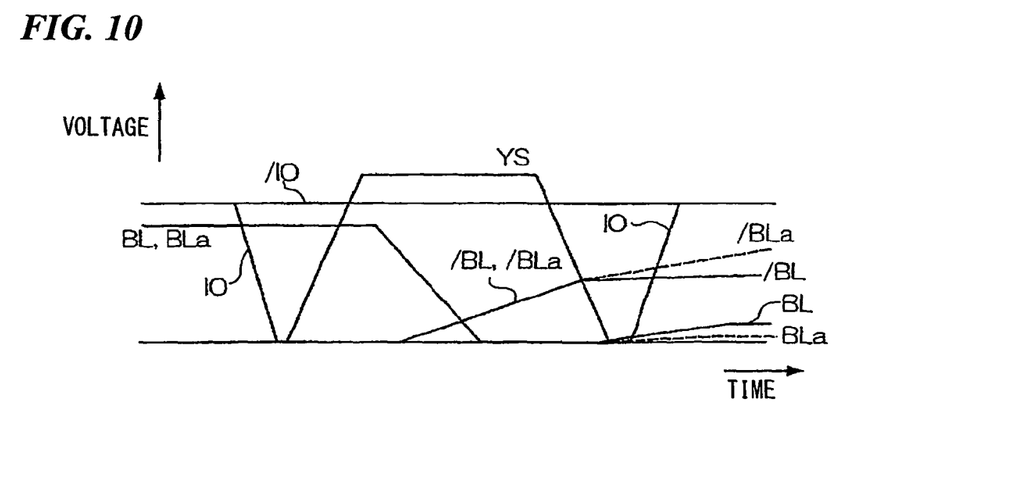
FIG. 10 is a typical waveform chart that shows drive waveforms of bit lines by a sense amplifier.

A second problem when the Tr gate width is reduced is that a data holding operation after a write operation (a rewriting operation) is delayed. In the write operation, the IO lines IO and /IO reverse electric potential of the bit lines BL and /BL via a transistor driven by the column switch line YS as shown in FIG. 10 when data to be written and data held in the sense amplifier are different from each other. In addition, FIG. 10 is a signal waveform chart showing a change of each signal line in the same configuration as that of FIG. 9. However, in connection with the bit lines BL and /BL shown in FIG. 10, the waveform when the Tr gate width of the CMOS flip-flop is reduced is shown as BL and /BL and the waveform when the Tr gate width of the CMOS flip-flop is not so small is shown as BLa and /BLa.

In the state where the column switch line YS is turning on transistors that connect the IO lines IO and /IO and the bit lines BL and /BL (in the state of YS=high), the IO line IO being driven draws electric charge of the bit line BL to reverse BL to a low level. If an ON time interval of the column switch line YS is terminated (the column switch line YS is usually a one-shot operation), the drive of the bit line BL after that is performed by the CMOS flip-flop. Although the bit line /BL is driven by the IO line /IO to a high level, the sense amplifier (waveform /BL) with the small Tr gate width has a further increased time arriving at an array voltage than that of the conventional sense amplifier (waveform /BLa) in which the Tr gate width is not so small.

Furthermore, since the bit lines BL and /BL are finely arranged, the resistance thereof is high. Far end portions of the bit lines BL and /BL require time for which the electric charge is completely pulled out. If the Tr gate width of the CMOS flip-flop is small, the bit line BL floats at a falling edge of the column switch line YS (waveform BL). Due to the reduction of the voltage Vgs between the gate and the source, the capability of electric current of Pch Tr further decreases and a time arriving at an array voltage level largely increases (waveform /BL).

SUMMARY

The present invention seeks to solve one or more of the above problems, or to improve those problems at least in part.

In one embodiment, there is provided a sense amplifier controlling circuit for controlling a sense amplifier in a semiconductor memory, the sense amplifier amplifying differential electric potential of a pair of bit lines to which memory cells are connected by sequentially operating a first amplifier circuit and a second amplifier circuit performing an amplification operation different from each other. The sense amplifier controlling circuit includes a first portion that activates the second amplifier circuit at an early operation stage of the first amplifier circuit.

In one embodiment, there is provided a sense amplifier controlling method for controlling a sense amplifier in a semiconductor memory, the sense amplifier amplifying differential electric potential of a pair of bit lines to which memory cells are connected by sequentially operating a first amplifier circuit and a second amplifier circuit performing an amplification operation different from each other. The sense amplifier controlling method includes activating the second amplifier circuit at an early operation stage of the first amplifier circuit, and activating the second amplifier circuit independently of activation of the first amplifier circuit during the amplification operation of the first amplifier circuit.

In one embodiment, there is provided a sense amplifier controlling circuit for controlling a sense amplifier in a semiconductor memory, the sense amplifier amplifying differential electric potential of a pair of bit lines to which memory cells are connected by sequentially operating a first amplifier circuit and a second amplifier circuit performing an amplification operation different from each other. The sense amplifier controlling circuit includes an unit that activates the second amplifier circuit together with a column switch of the sense amplifier and independently of activation of the first amplifier circuit, and inactivates the second amplifier circuit after a predetermined time elapses, during the amplification operation of the first amplifier circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Configuration of Embodiment

The invention will be described herein with reference to illustrative embodiments. Those skilled in the art will recognize that many alternative embodiments can be accomplished using the teachings of the present invention and that the invention is not limited to the embodiments illustrated here for explanatory purposes.

Figure 1:
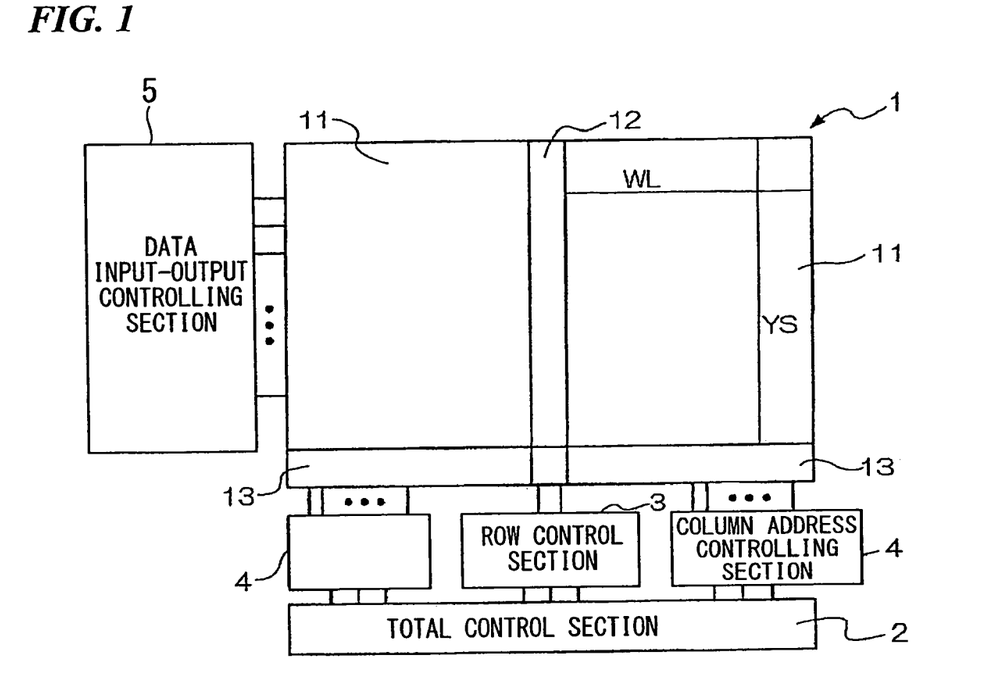
FIG. 1 is a block diagram that shows an entire configuration of a semiconductor memory mounting a preamplifier thereon according to a first embodiment of the present invention.

FIG. 1 shows a block diagram of an entire configuration of a semiconductor memory mounting a preamplifier thereon according to a first embodiment of the present invention. The semiconductor memory shown in FIG. 1 includes a cell array 1, a total control section 2 principally made of a command decoder, a control section 3 (a row control section 3) that controls a row address and a control signal, an address signal control section 4 (a column address controlling section 4) that controls a plurality of columns, and a control section 5 that controls data input and output (a data input-output controlling section 5). The cell array 1 includes a plurality of memory cell blocks 11 of which each is made of a plurality of memory cells, a row address decoder 12, and a column address decoder 13. The semiconductor memory according to this embodiment can rewrite data onto a desired address of a memory cell and read data from the memory cell by inputting a predetermined command from the outside into the data input-output controlling section 5 and further inputting an address and data.

The total control section 2 is respectively connected to the row control section 3, the plurality of column address controlling sections 4, and the data input-output controlling section 5 via a bus signal line and a control signal line. The cell array 1 is respectively connected to the row control section 3 and the plurality of column address controlling section 4 via an address signal line and the control signal line. The cell array 1 is connected to the data input-output controlling section 5 via a data bus signal line. The row address decoder 12 is connected to the row control section 3. The row address decoder 12 is connected to the plurality of memory cell blocks 11 via a plurality of word lines WL and a plurality of sense amplifier control signal lines. The plurality of column address decoders 13 are respectively connected to the column address controlling sections 4. The plurality of column address decoders 13 are connected to the memory cell blocks 11 via a column switch line YS.

Figure 2:
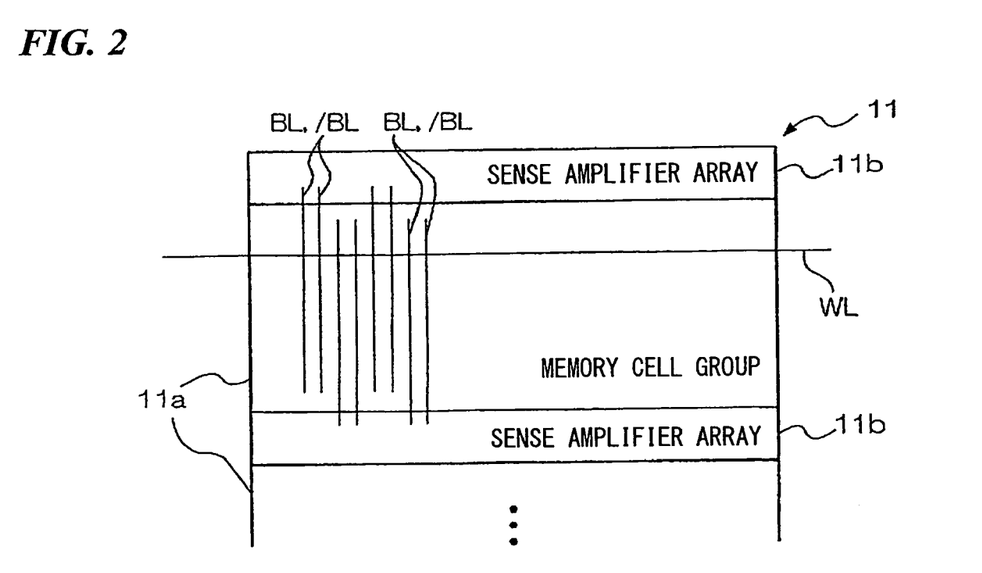
FIG. 2 is a block diagram that shows a configuration of a memory cell block 11 shown in FIG. 1.

FIG. 2 shows a block diagram of the memory cell blocks 11 shown in FIG. 1. The memory cell blocks 11 have plural sets of a memory cell group 11a in which a plurality of memory cells is arranged in a reticular pattern (matrix pattern) and a sense amplifier array 11b that is made of a plurality of sense amplifiers. Each memory cell included in the memory cell group 11a includes one transistor and one capacitor.

In recent years, the memory cell group 11a and the sense amplifier array 11b may be further divided by a division row decoder in many cases. The sense amplifier array 11b is connected to the row address decoder 12 shown in FIG. 1 via the plurality of sense amplifier control signal lines. The memory cell group 11a is connected to the row address decoder 12 via the plurality of word lines WL. Moreover, the memory cell group 11a is connected to the sense amplifier array 11b via plural sets of complementary bit lines BL and /BL.

The arrangement method of bit lines for the sense amplifier shown in FIG. 2 is a folded type (complementary bit line BL and bit line /BL belong to the same memory cell group). There can be also applied an open bit type (complementary bit line BL and bit line /BL belong to different memory cell groups while placing the sense amplifier array therebetween).

Figure 3:
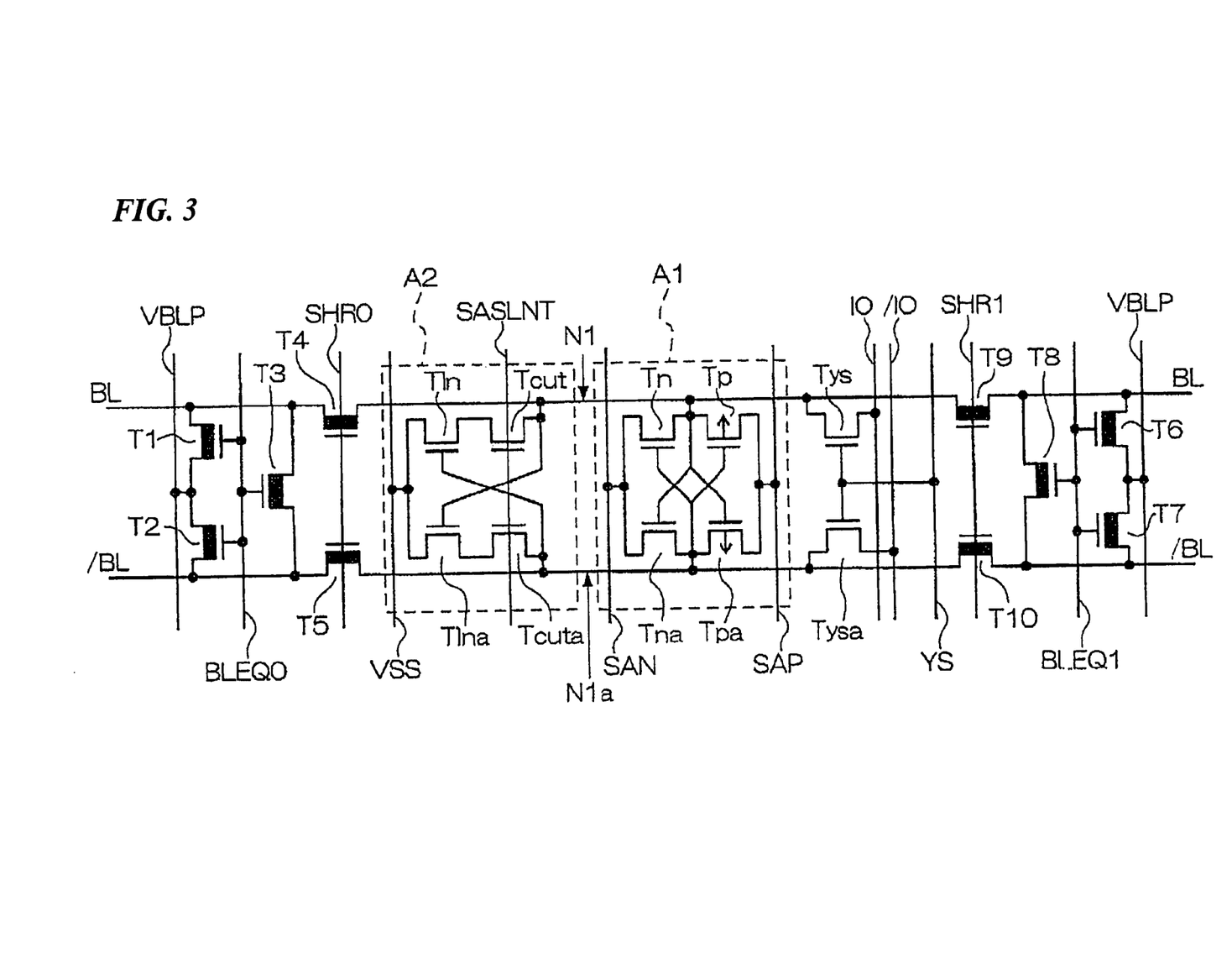
FIG. 3 is a circuit diagram that shows each sense amplifier included in a sense amplifier array 11b shown in FIG. 2.

FIG. 3 shows a circuit diagram of each sense amplifier included in the sense amplifier array 11b. Each sense amplifier includes a CMOS flip-flop A1 and a preamplifier A2. Each sense amplifier amplifies the differential electric potential of the pair of bit lines BL and /BL to which memory cells are connected by sequentially starting or stopping (operating) the CMOS flip-flop A1 and the preamplifier A2.

As described above, the preamplifier A2 is an amplifier circuit added to the CMOS flip-flop A1. The preamplifier A2 performs an amplification operation different from that of the CMOS flip-flop A1 at an early stage of the sense operation or the like. The preamplifier A2 is controlled so as to operate at an early stage of the sense operation and stop the operation at the stage where the differential electric potential of the pair of bit lines BL and /BL is sufficiently amplified. However, in the present embodiment, an increase of drive capability of the sense amplifier is planned by operating the preamplifier A2 during the operation of the CMOS flip-flop A1 in a read operation and a write operation.

In addition, plural sets of memory cells, which include a transistor driven by the word line WL not illustrated and a capacitor connected to the transistor, are connected to the complementary bit lines BL and /BL.

The sense amplifier control signal lines SHR0 and SHR1 are connected to the row address decoder 12 shown in FIG. 1. In order to disconnect the bit lines BL and /BL connected to a memory cell that is decided not to be selected by the address decode result from the sense amplifier, the corresponding SHR0 or SHR1 is driven to a low level. The sense amplifier control signal lines BLEQ0 and BLEQ1 are connected to the row address decoder 12. In order to release the equalization of the bit lines BL and /BL connected to a memory cell that is decided to be selected by the address decode result, the corresponding BLEQ0 or BLEQ1 is driven to a low level.

In FIG. 3, the gates of Nch transistors T1, T2, and T3 are connected to the sense amplifier control signal line BLEQ0. The drain of Tr T1 is connected to a power supply line VBLP and the source of Tr T1 is connected to the bit line BL. The drain of Tr T2 is connected to the power supply line VBLP and the source of Tr T2 is connected to the bit line /BL. The drain and source of Tr T3 are connected to the bit lines BL and /BL. The gates of Nch Tr T4 and Nch Tr T5 are connected to the sense amplifier control signal line SHR0. The bit lines BL and /BL are respectively connected to nodes N1 and N1a via Tr T4 and Tr T5.

On the other hand, the gates of Nch transistors T6, T7, and T8 are connected to the sense amplifier control signal line BLEQ1. The drain of Tr T6 is connected to the power supply line VBLP, the source of Tr T6 is connected to the bit line BL, the drain of Tr T7 is connected to the power supply line VBLP, and the source of Tr T7 is connected to the bit line /BL. The drain and source of Tr T8 are connected to the bit lines BL and /BL. The gates of Nch Tr T9 and Nch Tr T10 are connected to the sense amplifier control signal line SHR1. The bit lines BL and /BL are respectively connected to the nodes N1 and N1a via Tr T9 and Tr T10.

The column switch line YS is connected to the column address decoder 13 shown in FIG. 1. When the address decode result is selected, the column switch line YS becomes a high level by a one-shot drive. The column switch line YS is connected to the gates of Tr Tys and Tr Tysa. The drains of Tr Tys and Tr Tysa are respectively connected to the IO lines IO and /IO. The sources of Tr Tys and Tr Tysa are respectively connected to the nodes N1 and N1a.

The CMOS flip-flop A1 includes Pch transistors Tp and Tpa, and Nch transistors Tn and Tna, in which mutual drains and gates are cross connected. In other words, the gates of Pch Tr Tp and Nch Tr Tn are connected to the drains of Pch Tr Tpa and Nch Tr Tna, and the drains of Pch Tr Tp and Nch Tr Tn are connected to the gates of Pch Tr Tpa and Nch Tr Tna. The drains of Tr Tp and Tr Tn are connected to the node N1, and the drains of Tr Tpa and Tr Tna are connected to the node N1a. SAP and SAN are the sense amplifier control signal lines. The sources of Tr Tp and Tr Tpa are connected to SAP, and the sources of Tr Tn and Tr Tna are connected to SAN. When SAP and SAN are active, the CMOS flip-flop A1 operates.

The preamplifier A2 includes Nch transistors Tcut and Tcuta, and Nch transistors Tln and Tlna. A preamplifier driving signal line SASLNT that is a sense amplifier control signal is connected to the gates of Tr Tcut and Tr Tcuta. When the preamplifier driving signal SASLNT is a high level, Nch Tr Tln and Nch Tr Tlna are connected to the pair of bit lines BL and /BL via Tr Tcut and Tr Tcuta that are turned on. The sources of Tr Tln and Tr Tlna are connected to a ground power supply line VSS, the drains of Tr Tln and Tr Tlna are respectively connected to the sources of Tr Tcut and Tr Tcuta, and the gates of Tr Tln and Tr Tlna are respectively connected to the drains of Tr Tcuta and Tr Tcut and the nodes N1 and N1a. It is desirable to use a transistor with lower Vth for the preamplifier A2 than that for the CMOS flip-flop A1 in order to improve the effects of the preamplifier A2. More preferably, the transistors with lower Vth are Tr Tln and Tr Tlna.

Figure 4:
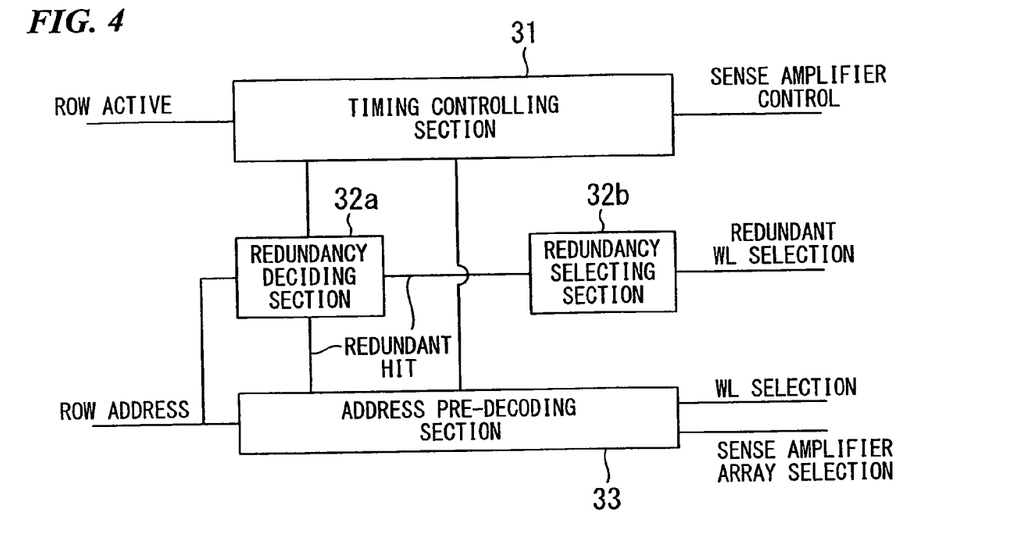
FIG. 4 is a block diagram that shows a configuration of a row control section 3 shown in FIG. 1.

FIG. 4 shows a block diagram of a configuration of the row control section 3 shown in FIG. 1. The row control section 3 includes a timing controlling section 31, a redundancy deciding section 32a, a redundancy selecting section 32b, and an address pre-decoding section 33. A row address signal line is connected to the redundancy deciding section 32a and the address pre-decoding section 33. The row address signal line is connected to the total control section 2. The redundancy deciding section 32a and the address pre-decoding section 33 are connected to each other through a redundant hit signal line. When a redundant hit signal is activated, the address pre-decoding section 33 deactivates a word line selection signal (a WL selection signal) to stop the selection of the word line WL by the row address decoder 12. On the other hand, the redundancy deciding section 32a and the redundancy selecting section 32b are connected to each other through a redundant hit signal line including a decode logic. When a redundant hit signal is activated, the redundancy selecting section 32b activates a redundant word line selection signal (a redundant WL selection signal) to cause the row address decoder 12 to select the redundant word line WL.

The redundancy selecting section 32b and the cell array 1 are connected to each other via a redundant word line selection signal line (a redundant WL selection signal line). The address pre-decoding section 33 is connected to the cell array 1 via the word line selection signal line and the sense amplifier array selection signal line. The timing controlling section 31 is connected to the total control section 2 via a row active signal line, the timing controlling section 31 is connected to the cell array 1 via the sense amplifier control signal line as shown in FIG. 3, and the timing controlling section 31 is further connected to the redundancy deciding section 32a and the address pre-decoding section 33 via a plurality of control signal lines.

Figure 5:
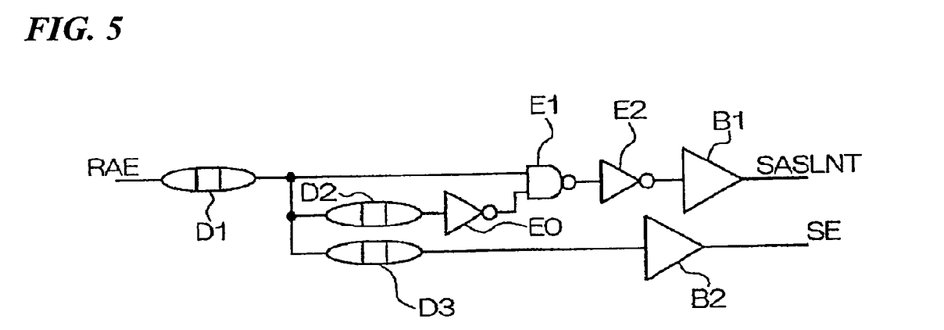
FIG. 5 is a circuit diagram used for describing a row timing controlling circuit included in a timing controlling section 31 shown in FIG. 4.
Figure 6:
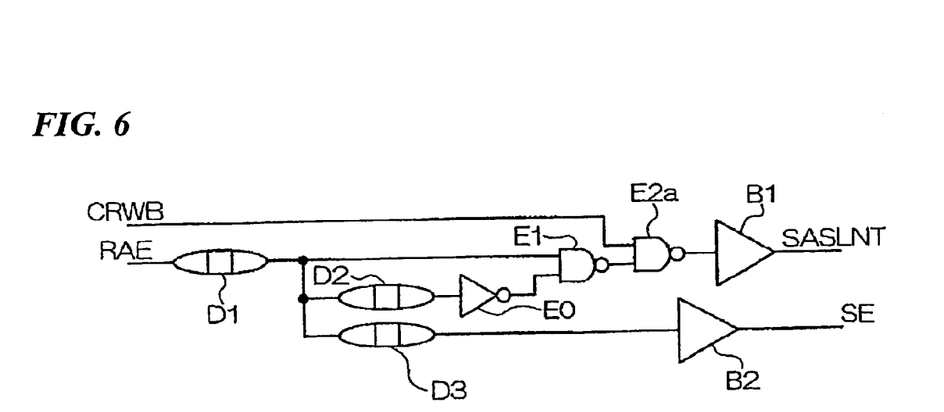
FIG. 6 is a circuit diagram that shows a configuration of the row timing controlling circuit included in the timing controlling section 31 shown in FIG. 4.

FIG. 6 shows a circuit diagram of a row timing controlling circuit that is included in the timing controlling section 31 shown in FIG. 4. The row timing controlling circuit controls the sense amplifier control signals SASLNT and SE. The configuration and operation of the circuit shown in FIG. 6 form a characteristic of the present invention. A circuit used for describing the characteristic is shown in FIG. 5.

FIG. 5 shows a circuit diagram used for describing an embodiment of the present invention. The circuit shown in FIG. 5 is included in the timing controlling section 31 shown in FIG. 4. The circuit shown in FIG. 5 is a row timing controlling circuit that controls the preamplifier driving signal SASLNT which is the sense amplifier control signal shown in FIG. 3 and the sense amplifier activating signal SE. A flag signal RAE permitting the starting of the sense amplifier is connected to a delay D1 in accordance with a rising edge of the word line WL. The delay D1 is connected to delays D2 and D3, and an input of a NAND element E1. In an inverter element E2, one input thereof is connected to an output from the NAND element E1 and its output is connected to a buffer circuit B1. The buffer circuit B1 drives the preamplifier driving signal SASLNT, which is the sense amplifier control signal. The output of the delay D2 is connected to the other input of the NAND element E1 via an inverter element E0.

The sense amplifier control signal line SE is connected to an output of the buffer circuit B2. The input of the buffer circuit B2 is connected to the delay D3. When this sense amplifier control signal SE is a high level, the sense amplifier control signal SAP shown in FIG. 3 is driven to an array power supply voltage level and the sense amplifier control signal SAN is driven to a GND level in the row address decoder 12 shown in FIG. 1.

FIG. 6 shows a circuit diagram of a row timing controlling circuit that is included in the timing controlling section 31. The row timing controlling circuit controls the preamplifier driving signal SASLNT that is the sense amplifier control signal and the sense amplifier activating signal SE, in the present invention. The configuration of delays D1, D2, and D3, an inverter element E0, a NAND element E1, and buffer circuits B1 and B2 is equal to that of FIG. 5. However, a NAND element E2a is provided in place of the inverter element E2. One input of the NAND element E2a is connected to an output of the NAND element E1. An output of the NAND element E2a is connected to an input of the buffer circuit B1. Furthermore, a flag signal CRWB becoming a low level in the read operation and the write operation is connected to the other input of the NAND element E2a.

The flag signal CRWB is a signal output from the total control section 2 shown in FIG. 1. The flag signal CRWB is generated in accordance with a command input from the outside or in accordance with an internal operating state. The flag signal CRWB becomes a low level in the read operation and the write operation. While the word line WL is active (in other words, when a row is in an active state), the flag signal CRWB can be generated independently of a row control signal such as a row address signal or a row active signal. In other words, the flag signal CRWB drives the preamplifier A2 during the read operation and the write operation at a timing other than an early stage of operation start of the CMOS flip-flop A1.

[Description of Operation of Embodiment]

Figure 7A:
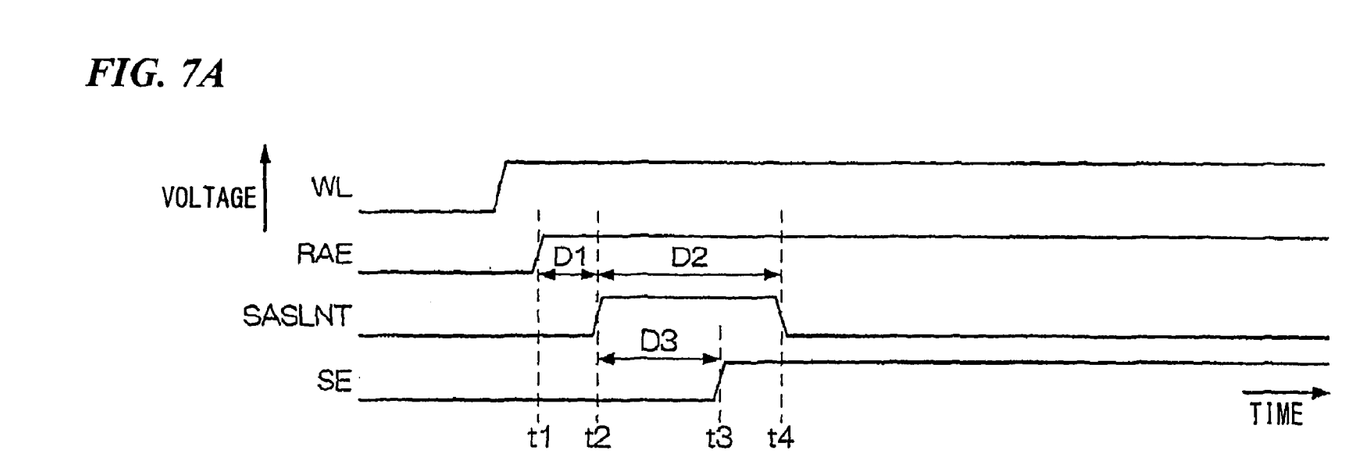
FIG. 7A is a signal waveform chart that shows signal waveforms of a semiconductor memory having the row timing controlling circuit shown in FIG. 5.

Next, a control action of the preamplifier through signal waveform charts shown in FIG. 7A and FIG. 7B will be described hereinbelow. FIG. 7A shows a signal waveform chart of a semiconductor memory having the row timing controlling circuit shown in FIG. 5. The word line WL rises, and the flag signal RAE permitting a sense start becomes a high level (time t1). After a characteristic delay of the delay D1 passes, the preamplifier driving signal SASLNT becomes a high level and the preamplifier A2 is driven (time t2). The time for which the preamplifier driving signal SASLNT holds a high level is a time corresponding to a characteristic delay of the delay D2, and then the driving signal SASLNT becomes a low level (time t4). On the other hand, after the characteristic delay of the delay D1 and a characteristic delay of the delay D3 pass from time t1, the sense amplifier activating signal SE becomes a high level (time t3). The characteristic delay amounts of the delay D1, the delay D2, and the delay D3 are respectively an arbitrary amount, and each amount is optimized in a circuit design process.

Figure 8:
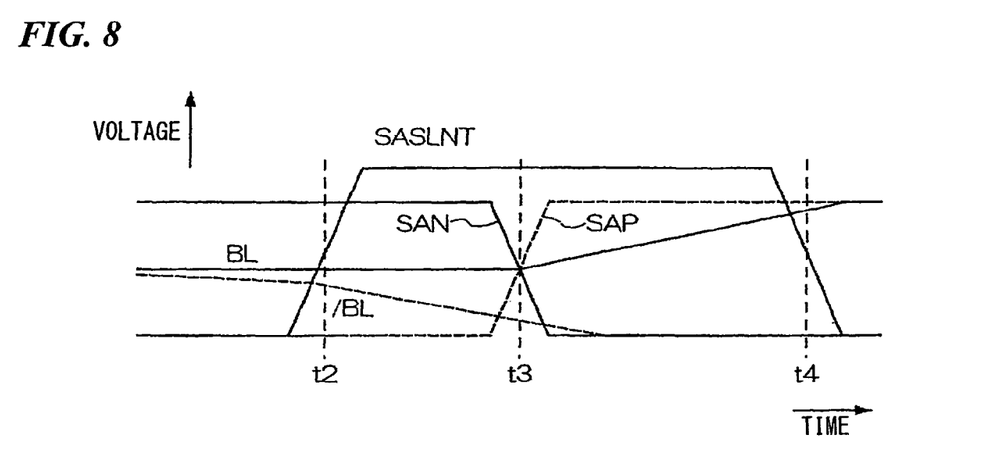
FIG. 8 is a signal waveform chart that shows signal waveforms of sense amplifiers A1 and A2 shown in FIG. 3 at times t2 to t4 shown in FIG. 7A and FIG. 7B.

FIG. 8 shows a signal waveform chart of a sense amplifier in a part in which the preamplifier driving signal SASLNT becomes a high level in FIG. 7A (times t2 to t4). When the word line WL becomes high, differential electric potential occurs on the pair of bit lines BL and /BL. The characteristic delay of the delay D1 of the row timing controlling circuit shown in FIG. 5 is so set that the preamplifier driving signal SASNLT becomes a high level as the differential electric potential of the pair of bit lines BL and /BL approaches saturation. According to this, the electrical potential of any bit line with lower potential of the pair of bit lines BL and /BL is further reduced. FIG. 8 shows an example where low data is accumulated on a memory cell connected to the bit line /BL. When data of a memory cell is high or when the bit line BL is connected to a memory cell, the series of operations are similar. The characteristic delay of the delay D2 of the row timing controlling circuit is so set that the differential electric potential between the bit line BL and the bit line /BL is expanded in the degree of being sufficiently amplified even in the CMOS flip-flop A1 and then the sense amplifier activating signal SE becomes a high level. After the sense amplifier activating signal SE becomes a high level, the sense amplifier control signal SAP is driven to an array power supply voltage level and the sense amplifier control signal SAN is driven to a GND level in the row address decoder 12. Here, a predetermined CMOS flip-flop A1 starts operation.

At this time, amplification capability of the sense amplifier becomes maximum, one of the bit lines BL and /BL is amplified to the array power supply voltage level, and the other is amplified to the GND level. The characteristic delay of the delay D2 of the row timing controlling circuit shown in FIG. 5 is so set that the differential electric potential amplification of the pair of bit lines BL and /BL by the sense amplifier is saturated. The preamplifier driving signal SASLNT becomes a low level and the preamplifier A2 stops operation.

In general, in the row address decoder 12 shown in FIG. 1, the preamplifier driving signal SASLNT shown in FIG. 5 and FIG. 6 is operated by an AND logic (a logical product) with the sense amplifier array selection signal connected to the address pre-decoding section 33 shown in FIG. 4 and then is connected to the sense amplifier shown in FIG. 3. Similarly, the sense amplifier activating signal SE is operated by an AND logic (a logical product) with the sense amplifier array selection signal and then drives the sense amplifier control signals SAP and SAN.

In the row timing controlling circuit shown in FIG. 5, the time at which the preamplifier driving signal SASLNT becomes a high level is only an early stage of sense just before and just after the sense amplifier activating signal SE becomes a high level. Unless the word line WL is reset by a pre-charge command input from the outside, the preamplifier driving signal SASLNT does not become high again. In other words, the preamplifier driving signal SASLNT is fixed to a low level even in a read operation and a write operation. For this reason, there may be caused speed degradation of the read operation and speed degradation of data holding operation after the write operation.

Figure 7B:
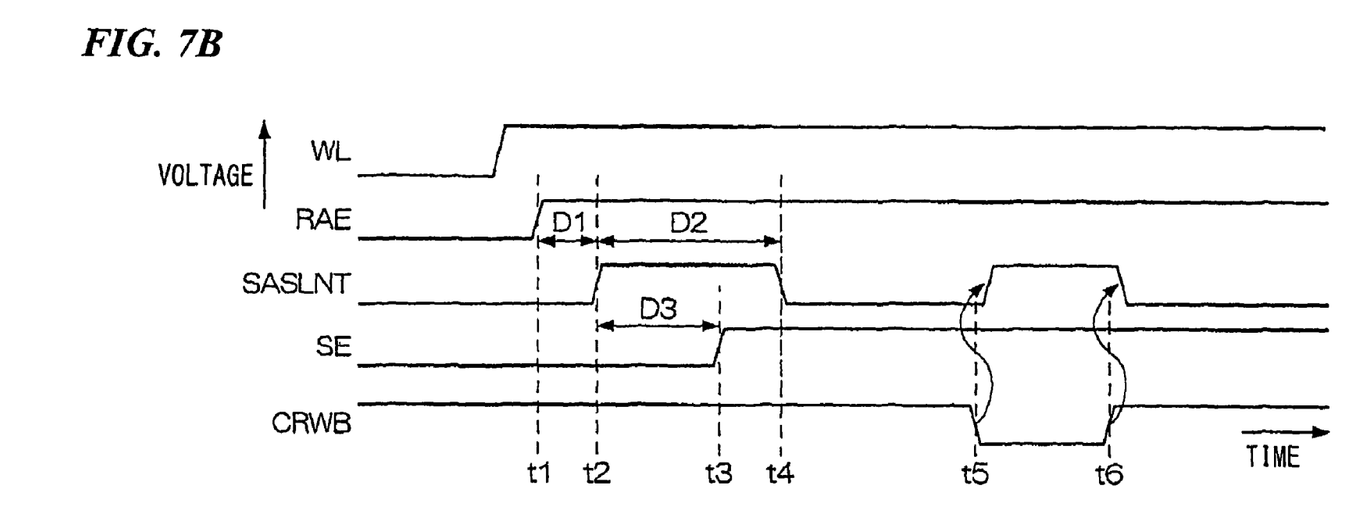
FIG. 7B is a signal waveform chart that shows signal waveforms of the semiconductor memory having the row timing controlling circuit shown in FIG. 6.

On the other hand, FIG. 7B shows a signal waveform chart of a semiconductor memory having the row timing controlling circuit of FIG. 6 according to the present invention. The waveform of each signal of the word line WL, the flag signal RAE permitting the start of sense, and the sense amplifier activating signal SE is similar to that of FIG. 7A. Similarly, a signal waveform chart of a sense amplifier before and after the sense amplifier activating signal SE becomes high is also shown in FIG. 8. The row timing controlling circuit shown in FIG. 6 includes a flag signal CRWB that becomes a low level during a read operation and a write operation, in which the flag signal CRWB is not in the row timing controlling circuit shown in FIG. 5. The preamplifier driving signal SASLNT is driven to high in response to the fact that the flag signal CRWB becomes low (times t5 to t6). When the word line WL is high, that is, when a row is in an active state, the flag signal CRWB operates independently of a control signal of the row. For this reason, the preamplifier driving signal SASLNT is driven to a high level even in a read operation and a write operation other than an early stage of sense.

Next, an advantage obtained by operating the preamplifier A2 in a read operation and a write operation other than an early stage of sense will be described hereinbelow. This is performed by holding the preamplifier driving signal SASLNT to a high level even at a time other than immediately after activating a sense amplifier by means of the row timing controlling circuit shown in FIG. 6.

A first advantage is to be able to restrain speed degradation of a read operation. Amplification capability of the sense amplifier, particularly the capability of Nch Tr (Tr Tn and Tr Tna shown in FIG. 3) is largely related to the drive capability of the IO line. In other words, the drive capability of the IO line becomes large that if the amplification capability of the sense amplifier is high. FIG. 9 typically shows a waveform of IO lines (IO lines IO and /IO) shown in FIG. 3 when driving the preamplifier A2 in a read operation and when not driving the preamplifier A2 in a read operation. When not driving the preamplifier A2 in a read operation, the drive capability of the IO line is low and thus electric charge is drawn by only a degree as shown with /IO in FIG. 9. On the other hand, when driving the preamplifier A2 in a read operation, electric charge is drawn by a degree as shown with /IOa in FIG. 9.

The data input-output controlling section 5 shown in FIG. 1 includes a main amplifier, and the main amplifier is connected to the IO lines. Operation of the main amplifier becomes stable if differential electric potential of a pair of IO lines is large. Adversely, when the differential electric potential of a pair of IO lines is not more than a certain level, normal amplification is not performed and thus a malfunction occurs. The differential electric potential of IO lines occurs and expands when the column switch line YS is turned on. One having larger differential electric potential of the pair of IO lines can shorten the time from ON of the column switch line YS (from a high level) to the start of the main amplifier. For this reason, a read operation can be performed at high speed. On the other hand, if the differential electric potential of the pair of IO lines is small, it takes time to obtain a potential difference required for the operation of the main amplifier and thus speed degradation of a read operation is caused.

A second advantage is to be able to restrain speed degradation of data holding after a write operation. Since the bit lines BL and /BL are formed by a fine process with respect to a peripheral circuit, a resistance value is high and it takes time to charge or discharge electric charge. In particular, when data of the bit lines BL and /BL are reversed by a write operation, it is considered that charging and discharging are not completed at a far end from the sense amplifier while the column switch line YS is being turned on.

FIG. 10 shows a waveform chart when data of the pair of bit lines BL and /BL shown in FIG. 3 are reversed by a write operation. The levels of the pair of bit lines BL and /BL when driving the preamplifier A2 in a write operation are shown as BLa and /BLa, and the levels of the pair of bit lines BL and /BL when not driving the preamplifier A2 are shown as BL and /BL. Since the IO lines are driven in a state where the column switch line YS is turned on, the bit lines BL and /BL operate at high speed. On the other hand, when the column switch line YS is turned off (when the column switch line YS becomes a low level), operating speed generally decreases in order that the sense amplifier drives the bit lines BL and /BL.

Since it becomes difficult to pull up electric charge which remains at far ends of the bit lines BL and /BL when the drive capability of Nch Tr (Tr Tn and Tr Tna shown in FIG. 3) of the sense amplifier is low, the differential electric potential once expanded is reduced as shown with BL and /BL in FIG. 10. Further, since the voltage Vgs between the gate and the source is reduced, the drive capability of Pch Tr (Tr Tp and Tr Tpa shown in FIG. 3) also decreases and amplification speed largely decreases as shown with /BL in FIG. 10. When the word line WL becomes low by a pre-charging operation if amplification speed of the pair of bit lines after a write operation is decreased, a memory cell cannot hold a sufficient data amount. A data holding time after a write operation must be extended to avoid a malfunction. If the drive capability of Nch Tr of the sense amplifier is guaranteed by driving the preamplifier A2 in a write operation, waveforms of the pair of bit lines BL and /BL become BLa and /BLa even when the column switch line YS is turned off and thus data holding speed degradation can be restrained.

A third advantage is to be able to keep a waiting current (stand-by current) to be low after the differential electric potential of the bit lines is saturated. When a read operation and a write operation are not performed, leakage current from the preamplifier A2 does not occur if the preamplifier A2 is controlled not to be driven by holding the flag signal CRWB to a high level. In addition, leakage current does not occur because the preamplifier A2 operates during a read operation and a write operation.

Furthermore, since the present invention additionally needs few logical elements, the area of the circuit does not substantially increase.

Another Embodiment of Invention

Next, a second embodiment of the present invention will be described in detail with reference to the drawings.

Figure 11:
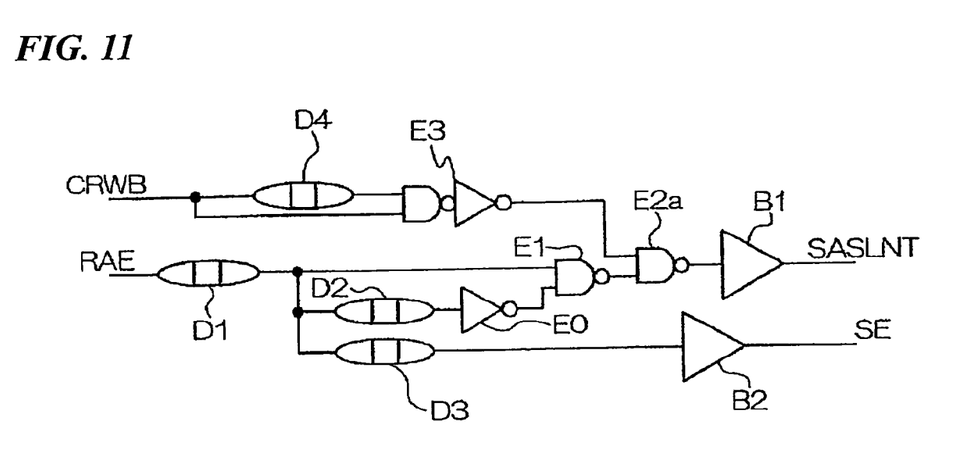
FIG. 11 is a circuit diagram that shows a row timing controlling circuit included in the timing controlling section 31 shown in FIG. 4 according to a second embodiment of the present invention.

FIG. 11 shows a configuration of a row timing controlling circuit according to the second embodiment of the present invention. The configuration of delays D1, D2, and D3, an inverter element E0, NAND elements E1 and E2a, and buffer circuits B1 and B2 is equal to that of FIG. 6. A flag signal CRWB is connected to an AND logic E3 made of a NAND element, an inverter element and a delay D4. The flag signal CRWB is not directly connected to the NAND element E2a, but an output of the AND logic E3 is connected to the NAND element E2a. In addition, an output of the delay D4 is connected to an input of the AND logic E3.

In recent years, a semiconductor memory can perform continuous read operation and write operation to improve the data transfer rate. When continuous read operation and write operation are performed, driving the preamplifier driving signal SASLNT from high to low whenever an individual read operation or write operation is completed and driving the preamplifier driving signal SASLNT from low to high by a subsequent read operation or write operation is to idly consume driving current of the preamplifier driving signal SASLNT. In order to avoid this state, the row timing controlling circuit shown in FIG. 11 provides a delay time from completing the individual read operation or write operation to driving the preamplifier driving signal SASLNT to low.

Figure 12A:
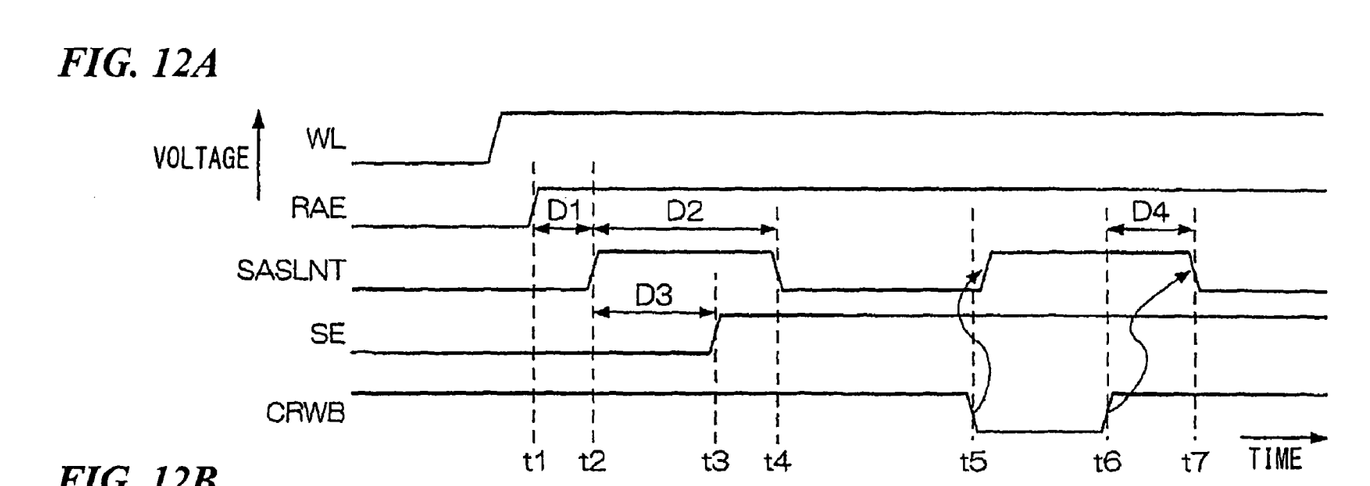
FIG. 12A is a signal waveform chart that shows signal waveforms of a semiconductor memory having the row timing controlling circuit shown in FIG. 11.

FIG. 12A shows a signal waveform chart of a semiconductor memory having the row timing controlling circuit shown in FIG. 11 according to the second embodiment of the present invention. The waveform of each signal of the word line WL, the flag signal RAE permitting the start of sense, and the sense amplifier activating signal SE is similar to that of FIG. 7B. The signal waveform chart of the sense amplifier before or after the sense amplifier activating signal SE at times t2 to t4 becomes high is similarly shown in FIG. 8. In FIG. 7B, the time for which the flag signal CRWB is low and the time for which the preamplifier driving signal SASLNT is high is the same (times t5 to t6). In FIG. 12A, the time (times t5 to t7) for which the preamplifier driving signal SASLNT is high is longer than the time (times t5 to t6) for which the flag signal CRWB is low. The difference between the time for which the flag signal CRWB is low and the time for which the preamplifier driving signal SASLNT is high becomes a delay amount set in the delay D4.

Figure 12B:
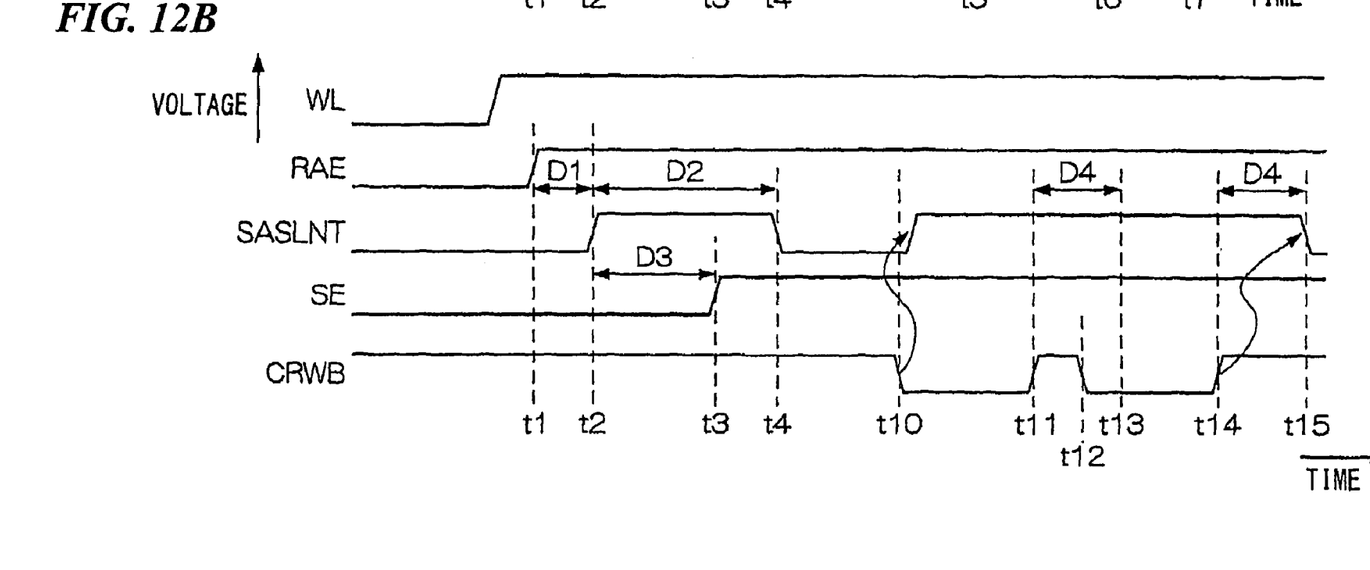
FIG. 12B is a signal waveform chart that shows signal waveforms of the semiconductor memory having the row timing controlling circuit shown in FIG. 11.

FIG. 12B shows a waveform chart when a continuous read operation or write operation is performed similarly to FIG. 12A in the semiconductor memory having the row timing controlling circuit shown in FIG. 11 according to the second embodiment of the present invention. The flag signal CRWB is low two times at times t10 to t11 and at times t12 to t14. Since the time interval (times t11 to t12) is shorter than a delay amount (times t11 to t13) of the delay D4, the preamplifier driving signal SASLNT becomes high at timing (time t10) at which the first flag signal CRWB becomes low and then does not become low until the second flag signal CRWB returns to high (time t14). However, the time at which the preamplifier driving signal SASLNT becomes low is time t15 after the passage of the delay amount of the delay D4 from time t14.

When a continuous read operation, a continuous write operation, or continuous read/write operation obtained by combining these are repeated at intervals not more than a delay amount of D4, electric current driving the preamplifier driving signal SASLNT is not generated just as the preamplifier driving signal SASLNT is driven to high. A delay amount of the delay D4 is set to an appropriate value by operating frequency demanded by the semiconductor memory and frequency of the continuous read operation or write operation.

Figure 13:
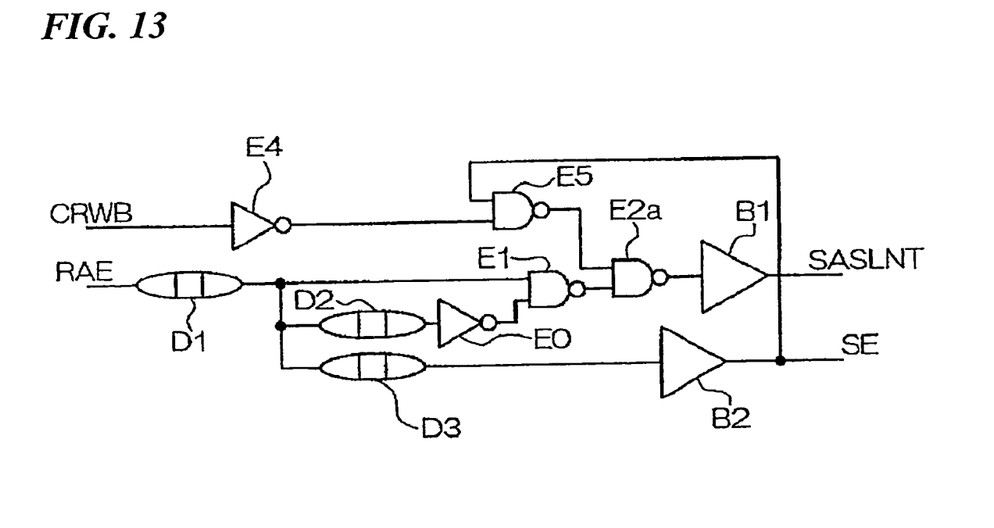
FIG. 13 is a circuit diagram that shows a row timing controlling circuit included in the timing controlling section 31 shown in FIG. 4 according to a third embodiment of the present invention.

Next, a third embodiment of the present invention will be described in detail with reference to the drawings. FIG. 13 shows a configuration of a row timing controlling circuit according to the third embodiment of the present invention. The configuration of delays D1, D2, and D3, an inverter element E0, NAND elements E1 and E2a, and buffer circuits B1 and B2 is equal to that of FIG. 6. A flag signal CRWB is connected to an inverter element E4. The inverter element E4 is connected to a NAND element E5. A sense amplifier activating signal SE is connected to the NAND element E5. The flag signal CRWB is not connected to the NAND element E2a, but the NAND element E5 is connected to the NAND element E2a.

As described above, the flag signal CRWB performs operations separated from a row control signal. In the row timing controlling circuit shown in FIG. 6, the preamplifier driving signal SASLNT is driven to high when the flag signal CRWB becomes low before the flag signal RAE permitting the start of sense becomes high. If the preamplifier driving signal SASLNT becomes high in the state where the differential electric potential does not occur on the pair of bit lines BL and /BL, the sense amplifier cannot be normally amplified.

After the passage of a constant time from a row active command, it is decided to generate a read command and a write command input from the outside. It is desirable that a control circuit has a protection mechanism to protect data against a false command.

The row timing controlling circuit shown in FIG. 13 additionally includes a protection mechanism in which the preamplifier driving signal SASLNT can be driven by the flag signal CRWB only after the sense amplifier activating signal SE becomes high and an early stage of sense passes. This protection mechanism is realized by taking a logical operation of the sense amplifier activating signal SE and the flag signal CRWB in the NAND element E5. On the other hand, in connection with the control of the preamplifier driving signal SASLNT by the flag signal RAE permitting the start of sense, operation of this protection mechanism is not obstructed. Moreover, the sense amplifier activating signal SE holds a high state until a pre-charge command is generated. For this reason, this protection mechanism does not obstruct the drive of the preamplifier driving signal SASLNT by the flag signal CRWB besides data protection at an early stage of sense.

Moreover, although the preamplifier A2 is made of NMOS in a circuit diagram shown in FIG. 3 of the present invention, the present invention includes a configuration providing PMOS and a configuration providing both of PMOS and NMOS.

According to the present invention, since a semiconductor memory includes a second portion that starts or stops a second amplifying circuit independently of operation of a first amplifying circuit during operation of the first amplifying circuit, it is possible to improve drive capability in the whole sense amplifier by driving a second amplification circuit (a preamplifier) in a read operation and a write operation. In this way, speeding up operation of the sense amplifier can be planned. Moreover, the generation of leakage current can be restrained by stopping operation of the second amplification circuit using the second circuit if it is not necessary.

As a field of use of the present invention, there is a digitally operated portable device such as a cellular phone or a portable media player. A sense amplifier mounting a preamplifier thereon according to the present invention has an advantage that an amplification speed in a low-voltage operation is improved. When a read operation and a write operation are not performed, a mechanism that stops the preamplifier and decreases leakage current contributes to low power consumption. A low-voltage operation and low power consumption contribute to the improvement of operable time of a digital portable device that is driven by a battery.

In addition, an embodiment of the present invention is not limited to the above, and the logic of the row timing controlling circuit show in FIG. 6 may be made of another combination. The buffer circuit may be omitted, or the delays D2 and D3 may be serially connected. The row timing controlling circuit may be included in a configuration other than the timing controlling section 31 shown in FIG. 4. The configuration of the second embodiment and the configuration of the third embodiment may be combined.

Moreover, the correspondence between components described in the scope of claims and components of the embodiment of the present invention described above is as follows: the first amplifier circuit is the CMOS flip-flop A1 shown in FIG. 3; the second amplifier circuit is the preamplifier A2 shown in FIG. 3; the first portion that activates the second amplifier circuit at an early operation stage of the first amplifier circuit is made of the delays D1, D2, and D3, the NAND elements E1 and E2, Nch transistors Tcut and Tcuta shown in FIG. 3, and so on that generate the preamplifier driving signal SASLNT in accordance with the flag signal RAE shown in FIG. 6; the second portion that starts and stops activation of the second amplifier circuit independently of operation of the first amplifying circuit during operation of the first amplifier circuit is made of the NAND element E2a shown in FIG. 6, Nch transistors Tcut and Tcuta shown in FIG. 3, and so on; the pair of transistors cross connecting is made of Nch transistors Tln and Tlna shown in FIG. 3; and the transistor that connect or disconnect the pair of transistors to or from the pair of bit lines is made of Nch transistors Tcut and Tcuta shown in FIG. 3.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A sense amplifier controlling circuit for controlling a sense amplifier in a semiconductor memory, the sense amplifier amplifying differential electric potential of a pair of bit lines to which memory cells are connected by sequentially operating a first amplifier circuit and a second amplifier circuit performing an amplification operation different from each other, the sense amplifier controlling circuit comprising
   a first portion that activates the second amplifier circuit at an early operation stage of the first amplifier circuit and inactivates the second amplifier circuit after a predetermined time elapses, wherein the first amplifier circuit and the second amplifier circuit are connected in common to the pair of bit lines.

2. The sense amplifier controlling circuit as recited in claim 1, further comprising a second portion that activates the second amplifier circuit independently of activation of the first amplifier circuit during the amplification operation of the first amplifier circuit.

3. The sense amplifier controlling circuit as recited in claim 2, wherein the second portion starts and stops activation of the second amplifier circuit in accordance with a predetermined signal, and continuously activates the second amplifier circuit for a predetermined time even when the predetermined signal indicates stop period of activation of the second amplifier circuit shorter than the predetermined time.

4. The sense amplifier controlling circuit as recited in claim 2, wherein the second portion starts and stops activation of the second amplifier circuit in accordance with a predetermined signal, and inactivates the second amplifier circuit regardless of an instruction of the predetermined signal when the first amplifier circuit stops performing the amplification operation.

5. The sense amplifier controlling circuit as recited in claim 2, wherein
   the first amplifier circuit is made of a complementary metal-oxide semiconductor (CMOS) flip-flop connected to the pair of bit lines, and
   the second amplifier circuit comprises a pair of transistors cross connecting and a transistor that connects or disconnects the pair of transistors to or from the pair of bit lines in accordance with a control by the second portion.

6. The sense amplifier controlling circuit as recited in claim 1, wherein the second amplifier circuit is activated before the activation of the first amplifier circuit, while the second amplifier circuit is inactivated during the amplification operation of the first amplifier circuit after activation of the first amplifier circuit.

7. The sense amplifier controlling circuit as recited in claim 1, wherein the second amplifier circuit has a threshold voltage lower than that of the first amplifier circuit.

8. The sense amplifier controlling circuit as recited in claim 5, wherein the pair of transistors has a threshold voltage lower than that of transistors included in the CMOS flip-flop.

9. The sense amplifier controlling circuit as recited in claim 5, wherein the pair of transistors is made of N-channel transistors.

10. The sense amplifier controlling circuit as recited in claim 2, wherein the second portion operates together with operation of a column switch of the sense amplifier and independently of the first portion.

11. The sense amplifier controlling circuit as recited in claim 10, wherein the second portion operates together with write operation of the sense amplifier and independently of the first portion.

12. The sense amplifier controlling circuit as recited in claim 11, wherein the second portion operates together with the write operation, and operates independently of the first portion after the column switch is inactivated with elapsing a predetermined time from activating the column switch.

13. A sense amplifier controlling circuit for controlling a sense amplifier in a semiconductor memory, the sense amplifier amplifying differential electric potential of a pair of bit lines to which memory cells are connected by sequentially operating a first amplifier circuit and a second amplifier circuit performing an amplification operation different from each other, the sense amplifier controlling circuit comprising:
   a first portion that activates the second amplifier circuit at an early operation stage of the first amplifier circuit and inactivates the second amplifier circuit after a predetermined time elapses; and
   a second portion that activates the second amplifier circuit independently of activation of the first amplifier circuit during the amplification operation of the first amplifier circuit,
   wherein:
   the first amplifier circuit is made of a complementary metal-oxide semiconductor (CMOS) flip-flop connected to the pair of bit lines,
   the second amplifier circuit comprises a pair of transistors cross connecting and a transistor that connects or disconnects the pair of transistors to or from the pair of bit lines in accordance with a control by the second portion,
   the pair of transistors cross connecting comprises a first and a second transistors, and the transistor that connects or disconnects the pair of transistors to or from the pair of bit lines comprises a third and a fourth transistors; and
   sources of the first and second transistors are connected to a ground power supply line, drains of the first and second transistors are respectively connected to sources of the third and fourth transistors, gates of the third and fourth transistors are connected to the control by the second portion, gate of the first transistor is connected to drain of the fourth transistor and one of the pair of bit lines, and gate of the second transistor is connected to drain of the third transistor and the other of the pair of bit lines.

14. The sense amplifier controlling circuit as recited in claim 13, wherein the first and second transistors have a threshold voltage lower than that of the third and fourth transistors.

15. A sense amplifier controlling method for controlling a sense amplifier in a semiconductor memory, the sense amplifier amplifying differential electric potential of a pair of bit lines to which memory cells are connected by sequentially operating a first amplifier circuit and a second amplifier circuit performing an amplification operation different from each other, the sense amplifier controlling method comprising:
   activating the second amplifier circuit at an early operation stage of the first amplifier circuit; and activating the second amplifier circuit independently of activation of the first amplifier circuit during the amplification operation of the first amplifier circuit before the activation of the first amplifier circuit; and inactivating the second amplifier circuit during the amplification operation of the first amplifier circuit after activation of the first amplifier circuit.

16. A sense amplifier controlling circuit for controlling a sense amplifier in a semiconductor memory, the sense amplifier amplifying differential electric potential of a pair of bit lines to which memory cells are connected by sequentially operating a first amplifier circuit and a second amplifier circuit performing an amplification operation different from each other, the sense amplifier controlling circuit comprising an unit that activates the second amplifier circuit together with a column switch operation and independently of activation of the first amplifier circuit, and inactivates the second amplifier circuit after a predetermined time elapses, during the amplification operation of the first amplifier circuit, wherein the first amplifier circuit and the second amplifier circuit are connected in common to the pair of bit lines.

17. The sense amplifier controlling circuit as recited in claim 16, wherein the unit operates together with write operation and independently of the amplification operation of the first amplifier circuit.

18. The sense amplifier controlling circuit as recited in claim 17, wherein the unit activates the second amplifier circuit independently of the first amplifier circuit after the column switch is inactivated with elapsing a predetermined time from activating the column switch.

19. The sense amplifier controlling circuit as recited in claim 16, wherein the unit continuously activates the second amplifier circuit together with continuative repetitions of activating/inactivating the column switch.

* * * * *